United States Patent
Lipton et al.

(10) Patent No.: US 7,952,261 B2
(45) Date of Patent: May 31, 2011

(54) ELECTROACTIVE POLYMER TRANSDUCERS FOR SENSORY FEEDBACK APPLICATIONS

(75) Inventors: Michael G. Lipton, Aptos, CA (US);
Ilya Polyakov, San Francisco, CA (US);
Alireza Zarrabi, Santa Clara, CA (US);
Otto Hui, Burlingame, CA (US); Silmon James Biggs, Los Gatos, CA (US);
Thomas A. Kridl, Los Altos, CA (US);
Gordon Russell, Redwood City, CA (US); Jonathan R. Heim, Pacifica, CA (US); Roger Hitchcock, San Leandro, CA (US); Chris A. Weaber, Montara, CA (US)

(73) Assignee: Bayer MaterialScience AG, Leverkusen (DE)

( * ) Notice: Subject to any disclaimer, the term of this patent is extended or adjusted under 35 U.S.C. 154(b) by 7 days.

(21) Appl. No.: 12/163,554

(22) Filed: Jun. 27, 2008
(Under 37 CFR 1.47)

(65) Prior Publication Data
US 2009/0001855 A1    Jan. 1, 2009

Related U.S. Application Data

(60) Provisional application No. 60/937,787, filed on Jun. 29, 2007.

(51) Int. Cl.
*H01L 41/08* (2006.01)
(52) U.S. Cl. .................. 310/339; 310/328; 310/800
(58) Field of Classification Search .......... 310/800
See application file for complete search history.

(56) References Cited

U.S. PATENT DOCUMENTS

| | | |
|---|---|---|
| 6,343,129 B1 | 1/2002 | Pelrine et al. |
| 6,376,971 B1 | 4/2002 | Pelrine et al. |
| 6,543,110 B1 | 4/2003 | Pelrine et al. |
| 6,545,384 B1 | 4/2003 | Pelrine et al. |
| 6,583,533 B2 | 6/2003 | Pelrine et al. |
| 6,586,859 B2 | 7/2003 | Kornbluh et al. |
| 6,628,040 B2 | 9/2003 | Pelrine et al. |
| 6,664,718 B2 | 12/2003 | Pelrine et al. |
| 6,707,236 B2 | 3/2004 | Pelrine et al. |
| 6,768,246 B2 | 7/2004 | Pelrine et al. |
| 6,781,284 B1 | 8/2004 | Pelrine et al. |
| 6,806,621 B2 | 10/2004 | Heim et al. |
| 6,809,462 B2 | 10/2004 | Pelrine et al. |
| 6,812,624 B1 | 11/2004 | Pei et al. |
| 6,876,135 B2 * | 4/2005 | Pelrine et al. ............ 310/339 |
| 6,882,086 B2 | 4/2005 | Kornbluh et al. |
| 6,891,317 B2 | 5/2005 | Pei et al. |
| 6,911,764 B2 | 6/2005 | Pelrine et al. |
| 6,940,211 B2 | 9/2005 | Pelrine et al. |
| 6,940,221 B2 | 9/2005 | Matsukiyo et al. |
| 7,148,789 B2 * | 12/2006 | Sadler et al. ............ 340/407.1 |
| 7,196,688 B2 | 3/2007 | Schena |
| 7,205,978 B2 * | 4/2007 | Poupyrev et al. ............ 345/157 |
| 7,211,937 B2 | 5/2007 | Kornbluh et al. |
| 7,224,106 B2 | 5/2007 | Pei et al. |

(Continued)

OTHER PUBLICATIONS

Prahlad, H. et al., "Programmable Surface Deformation: Thickness-Mode Electroactive Polymer Actuators and Their Applications," Proc. SPIE, vol. 5759, 102, 2005, 12 pages.

*Primary Examiner* — Mark Budd
(74) *Attorney, Agent, or Firm* — John E. Mrozinski, Jr.; Noland J. Cheung

(57) ABSTRACT

Electroactive polymer transducers for sensory feedback applications are disclosed.

13 Claims, 17 Drawing Sheets

U.S. PATENT DOCUMENTS

| | | |
|---|---|---|
| 7,233,097 B2 | 6/2007 | Rosenthal et al. |
| 7,259,503 B2 | 8/2007 | Pei et al. |
| 7,320,457 B2 | 1/2008 | Heim et al. |
| 7,339,572 B2 | 3/2008 | Schena |
| 7,342,573 B2 | 3/2008 | Ryynanen |
| 7,362,031 B2 | 4/2008 | Maita et al. |
| 7,368,862 B2 | 5/2008 | Pelrine et al. |
| 7,511,706 B2 * | 3/2009 | Schena .......................... 345/179 |
| 7,548,232 B2 * | 6/2009 | Shahoian et al. ............. 345/173 |
| 7,679,267 B2 * | 3/2010 | Heim ............................. 310/324 |
| 7,714,701 B2 * | 5/2010 | Altan et al. ................. 340/407.1 |
| 2002/0057257 A1 | 5/2002 | Hoggarth |
| 2004/0217671 A1 | 11/2004 | Rosenthal et al. |
| 2005/0157893 A1 | 7/2005 | Pelrine et al. |
| 2006/0016275 A1 | 1/2006 | Gravesen et al. |
| 2006/0186706 A1 * | 8/2006 | Browne et al. ........... 296/203.01 |
| 2006/0208609 A1 | 9/2006 | Heim |
| 2006/0208610 A1 | 9/2006 | Heim |
| 2006/0238079 A1 | 10/2006 | Pei et al. |
| 2006/0267376 A1 * | 11/2006 | McKnight et al. ......... 296/180.5 |
| 2007/0170822 A1 | 7/2007 | Pei et al. |
| 2007/0200453 A1 | 8/2007 | Heim |
| 2007/0200454 A1 | 8/2007 | Smith |
| 2007/0200457 A1 | 8/2007 | Heim et al. |
| 2007/0200466 A1 | 8/2007 | Heim |
| 2007/0200467 A1 | 8/2007 | Heydt et al. |
| 2007/0200468 A1 | 8/2007 | Heim |
| 2007/0222344 A1 * | 9/2007 | Kornbluh et al. ............ 310/800 |
| 2008/0022517 A1 | 1/2008 | Rosenthal et al. |
| 2008/0157631 A1 | 7/2008 | Heim et al. |

* cited by examiner

ELECTROACTIVE POLYMER TRANSDUCERS FOR SENSORY FEEDBACK APPLICATIONS

FIELD OF THE INVENTION

The present invention is directed to the use of electroactive polymer transducers to provide sensory feedback.

BACKGROUND

There are many known user interface devices which employ haptic feedback—the communication of information to a user through forces applied to the user's body, typically in response to a force initiated by the user. Examples of user interface devices which may employ haptic feedback include keyboards, touch screens, computer mice, trackballs, stylus sticks, joysticks, etc. The haptic feedback provided by these types of interface devices is in the form of physical sensations, such as vibrations, pulses, spring forces, etc., which are felt by the user.

Often, a user interface device with haptic feedback can be an input device which "receives" an action initiated by the user as well as an output device which provides haptic feedback indicating that the action was initiated. In practice, the position of some contacted or touched portion or surface, e.g., a button, of a user interface device is changed along at least one degree of freedom by the force applied by the user, where the force applied must reach some minimum threshold value in order for the contacted portion to change positions and to effect the haptic feedback. Achievement or registration of the change in position of the contacted portion results in a responsive force (e.g., spring-back, vibration, pulsing) which is also imposed on the contacted portion of the device acted upon by the user, which force is communicated to the user through his or her sense of touch.

One common example of a user interface device that employs a spring-back or "bi-phase" type of haptic feedback is a button on a mouse. The button does not move until the applied force reaches a certain threshold, at which point the button moves downward with relative ease and then stops— the collective sensation of which is defined as "clicking" the button. The user-applied force is substantially along an axis perpendicular to the button surface, as is the responsive (but opposite) force felt by the user.

Haptic feedback capabilities are known to improve user productivity and efficiency, particularly in the context of data entry. It is believed by the inventors hereof that further improvements to the character and quality of the haptic sensation communicated to a user may further increase such productivity and efficiency. It would be additionally beneficial if such improvements were provided by a sensory feedback mechanism which is easy and cost-effective to manufacture, and does not add to, and preferably reduces, the space, size and/or mass requirements of known haptic feedback devices.

SUMMARY OF THE INVENTION

The present invention includes devices, systems and methods involving electroactive transducers for sensory applications. In one variation, a user interface device having sensory feedback is provided. The device includes a user contact surface, an electroactive polymer transducer comprising an output member coupled to the contact surface, a sensor for sensing a mechanical force on the user contact surface and providing an activation signal to the transducer, wherein activation of the transducer moves at least a portion the user contact surface.

The coupling between the output member of the transducer and the user contact surface may include a mechanical means, magnetic means or both. In certain variations in which a mechanical coupling means is employed, at least one pin or protrusion extending between the output member and the user contact surface is provided. Where the pin or pins extends through the transducer sealing material, a compliant material may be used between the pin and the sealing material to ensure that the seal is not compromised upon movement of the pins. In certain embodiments, a pivotable lever is used to transfer motion from the transducer output member to the user contact surface whereby the pins extend from the lever through countersunk holes provided within the sealing material.

The user interface device may further include a sealing material adapted to substantially hermetically seal the transducer. A13. In certain embodiments, the sealing material forms a gasket between the user contact surface and the transducer, while in others, the sealing material encases the transducer.

The user interface device may be configured to provide a sensory feedback movement, i.e., movement of the contact surface which is sensed by the user, which is in a lateral or in a vertical direction relative to the contact surface. The user interface device may provide a single input or contact surface, e.g., a keypad, or may be provided in an array format having a plurality of contact surfaces, e.g., a keyboard.

The devices and systems of the present invention may be fabricated at least in part by web-based manufacturing techniques. For example, one such method includes forming at lest the transducers by such techniques where an electroactive polymer film is provided and an array of electrodes is formed on the film. The electrode array is then sandwiched between a top and bottom array of frame components to form an array of electroactive polymer transducers. The resulting array may be kept in array format or may be singulated into a plurality of individual transducers, depending on the type of user interface device.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings. To facilitate understanding, the same reference numerals have been used (where practical) to designate similar elements that are common to the drawings. Included in the drawings are the following.

Variation of the invention from that shown in the figures is contemplated.

DETAILED DESCRIPTION OF THE INVENTION

The devices, systems and methods of the present invention are now described in detail with reference to the accompanying figures.

Figure 1A:
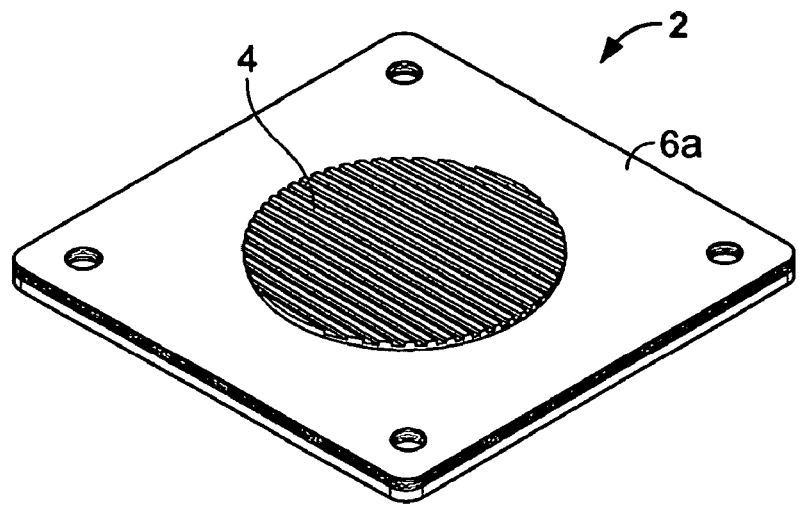
FIGS. 1A-1C show top perspective, bottom perspective and cross-sectional views, respectively, of a sensory feedback device of the present invention.
Figure 1B:
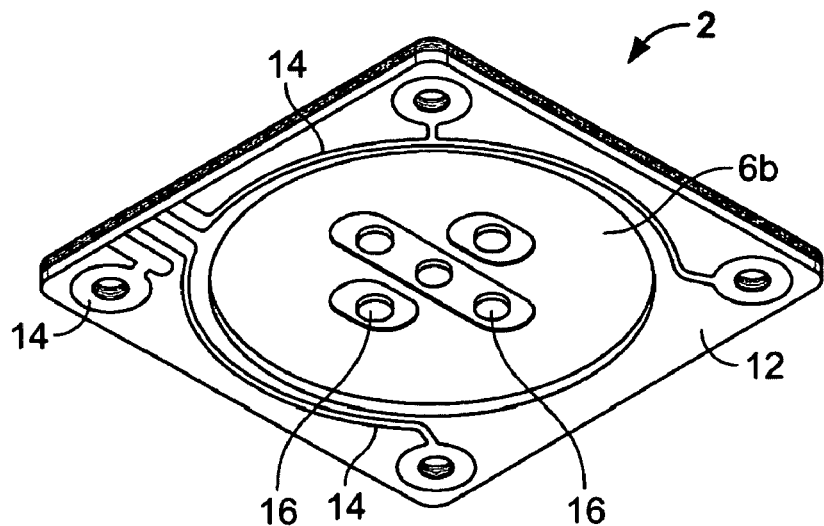
Figure 1C:
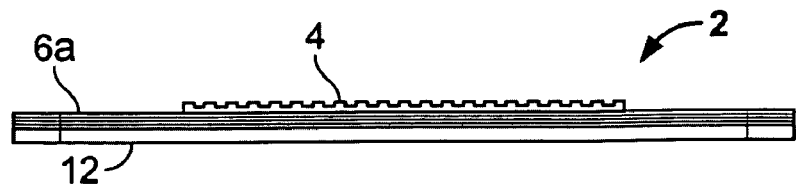

Referring to FIGS. 1A-1C, 2A and 2B, various views of are provided of an embodiment of a sensory feedback device 2 of the present invention which may be employed within a user interface device (not shown), such as with a single key within a keyboard or a discrete area of a touch screen. In an assembled form, as shown in FIGS. 1A-1C, sensory feedback device 2 has a very thin, low profile configuration (best illustrated in FIG. 1C) which may have any suitable width, length and height (thickness) dimensions to accommodate the user interface device component with which it is to be used. Typically, the width and length dimensions of device 2 substantially match or are within the width and length dimensions of the user contact surface with which it is associated. For example, for finger key or touch applications, the width and length dimensions of device 2 are typically in the range from about 10 mm to about 30 mm for square keys. The height or thickness dimension of device 2 is preferably as small as practically possible so as to reduce the profile (and size, weight and mass) of the device. For keypad applications, the thickness dimension of the device is typically about 2 mm, but may be less than about 1 mm.

Figure 2A:
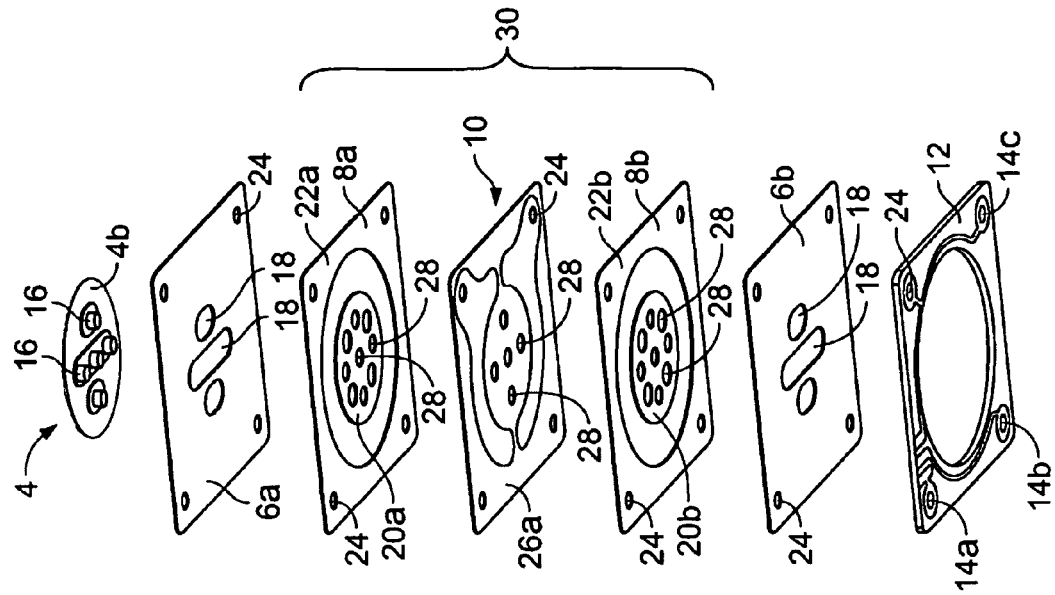
FIGS. 2A and 2B show exploded top and bottom perspective views, respectively, of the sensory feedback device of FIGS. 1A-1C.
Figure 2B:
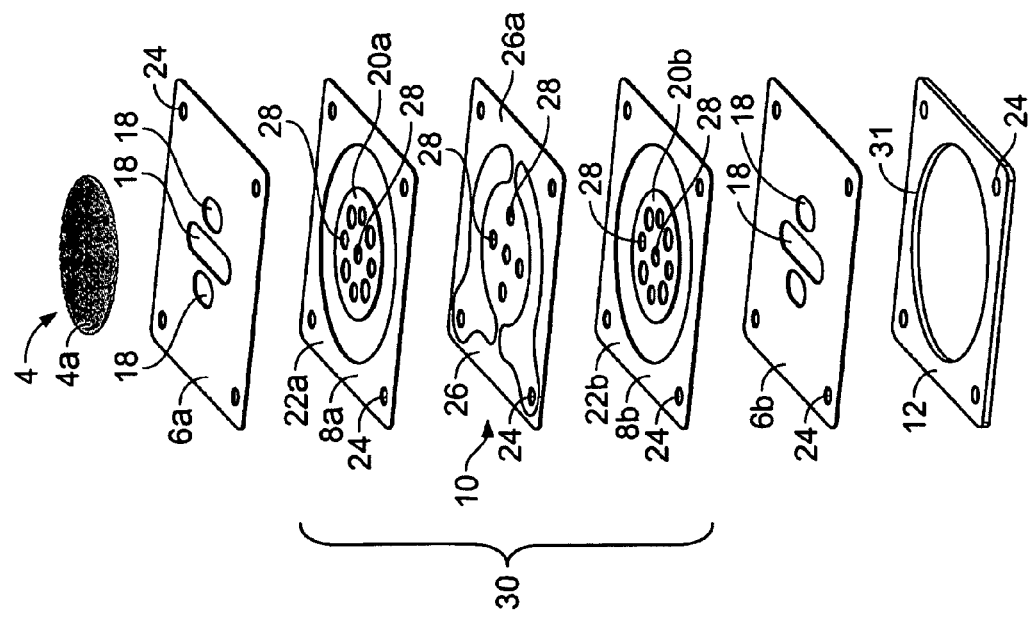

Sensory or haptic feedback device 2 includes various components including, from top to bottom as illustrated in FIGS. 2A an 2B, a user interface pad 4 having a top contact surface 4a and a bottom surface 4b having a plurality of protrusions 16, the function of which is discussed below. Top surface 4a may optionally be textured to minimize slippage by a user's finger. Pad 4 is positioned atop a sensory feedback mechanism or actuator 30. Actuator 30 includes an electroactive polymer (EAP) transducer 10 in the form of an elastic film which converts electrical energy to mechanical energy. The resulting mechanical energy is in the form of physical "displacement" of an output member, here in the form of a disc 28 (discussed in greater detail below), which displacement is sensed or felt by the user's finger.

Figure 3A:
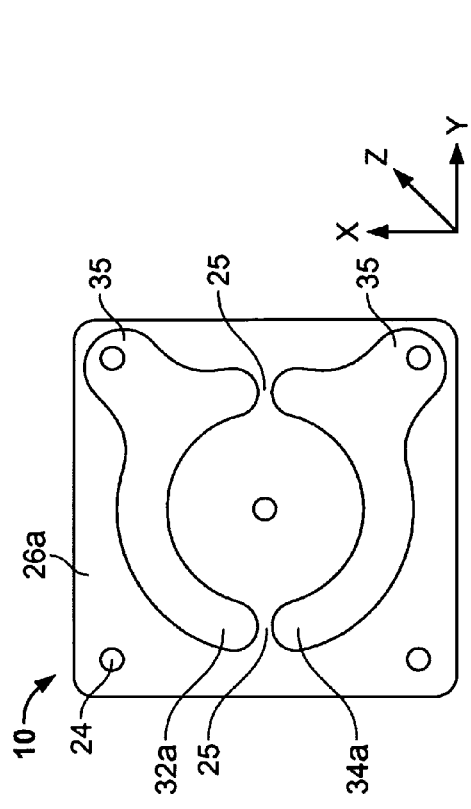
FIG. 3A is a top planar view of an assembled electroactive polymer actuator of the present invention.
Figure 3B:
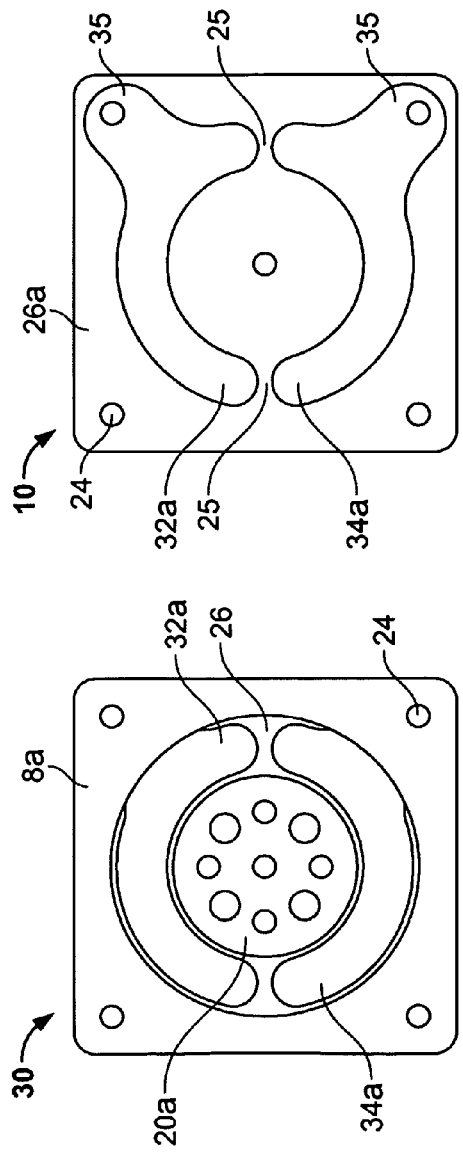
FIGS. 3B and 3C are top and bottom planar views, respectively, of the film portion of the actuator of FIG. 3A and, in particular, illustrate the two-phase configuration of the actuator.
Figure 3C:
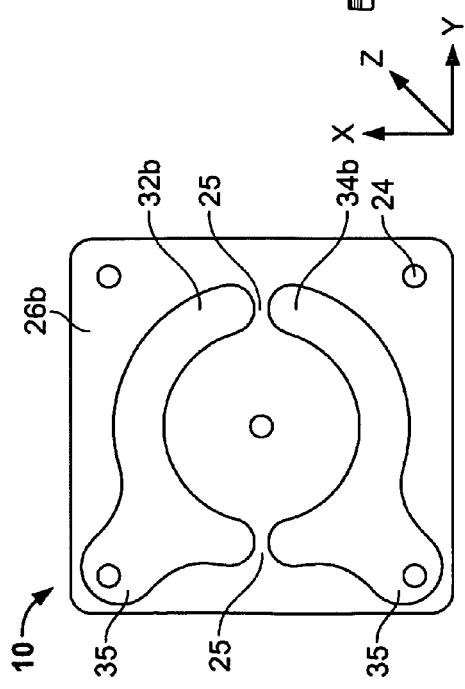

With reference to FIGS. 3A-3C, EAP transducer film 10 comprises two working pairs of thin elastic electrodes 32a, 32b and 34a, 34b where each working pair is separated by a thin layer of elastomeric dielectric polymer 26 (e.g., made of acrylic, silicone, or the like). When a voltage difference is applied across the oppositely-charged electrodes of each working pair (i.e., across electrodes 32a and 32b, and across electrodes 34a and 34b), the opposed electrodes attract each other thereby compressing the dielectric polymer layer 26 therebetween. As the electrodes are pulled closer together, the dielectric polymer 26 becomes thinner (i.e., the z-axis component contracts) as it expands in the planar directions (i.e., the x- and y-axes components expand) (see FIGS. 3B and 3C for axis references). Furthermore, like charges distributed across each electrode cause the conductive particles embedded within that electrode to repel one another, thereby contributing to the expansion of the elastic electrodes and dielectric films. The dielectric layer 26 is thereby caused to deflect with a change in electric field. As the electrode material is also compliant, the electrode layers change shape along with dielectric layer 26. Generally speaking, deflection refers to any displacement, expansion, contraction, torsion, linear or area strain, or any other deformation of a portion of dielectric layer 26. This deflection may be used to produce mechanical work.

In fabricating transducer 20, elastic film is stretched and held in a pre-strained condition by two opposing rigid frame sides 8a, 8b. It has been observed that the pre-strain improves the dielectric strength of the polymer layer 26, thereby improving conversion between electrical and mechanical energy, i.e., the pre-strain allows the film to deflect more and provide greater mechanical work. Typically, the electrode material is applied after pre-straining the polymer layer, but may be applied beforehand. The two electrodes provided on the same side of layer 26, referred to herein as same-side electrode pairs, i.e., electrodes 32a and 34a on top side 26a of dielectric layer 26 (see FIG. 3B) and electrodes 32b and 34b on bottom side 26b of dielectric layer 26 (see FIG. 3C), are electrically isolated from each other by inactive areas or gaps 25. The opposed electrodes on the opposite sides of the polymer layer from two sets of working electrode pairs, i.e., electrodes 32a and 32b for one working electrode pair and electrodes 34a and 34b for another working electrode pair. Each same-side electrode pair preferably has the same polarity, while the polarity of the electrodes of each working electrode pair are opposite each other, i.e., electrodes 32a and 32b are oppositely charged and electrodes 34a and 34b are oppositely charged. Each electrode has an electrical contact portion 35 configured for electrical connection to a voltage source (not shown).

In the illustrated embodiment, each of the electrodes has a semi-circular configuration where the same-side electrode pairs define a substantially circular pattern for accommodating a centrally disposed, rigid output disc 20a, 20b on each side of dielectric layer 26. Discs 20a, 20b, the functions of which are discussed below, are secured to the centrally exposed outer surfaces 26a, 26b of polymer layer 26, thereby sandwiching layer 26 therebetween. The coupling between the discs and film may be mechanical or be provided by an adhesive bond. Generally, the discs 20a, 20b will be sized relative to the transducer frame 22a, 22b. More specifically, the ratio of the disc diameter to the inner annular diameter of the frame will be such so as to adequately distribute stress applied to transducer film 10. The greater the ratio of the disc diameter to the frame diameter, the greater the force of the feedback signal or movement but with a lower linear displacement of the disc. Alternately, the lower the ratio, the lower the output force and the greater the linear displacement.

Because of their light weight and minimal components, EAP transducers offer a very low profile and, as such, are ideal for use in sensory/haptic feedback applications. Examples of EAP transducers and their construction are described in U.S. Pat. Nos. 7,368,862; 7,362,031; 7,320,457; 7,259,503; 7,233,097; 7,224,106; 7,211,937; 7,199,501; 7,166,953; 7,064,472; 7,062,055; 7,052,594; 7,049,732; 7,034,432; 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and U.S. Published Patent Application Nos. 2006/0208610; 2008/0022517; 2007/0222344; 2007/0200468; 2007/0200467; 2007/0200466; 2007/0200457; 2007/0200454; 2007/0200453; 2007/0170822; 2006/0238079; 2006/0208610; 2006/0208609; and 2005/0157893, the entireties of which are incorporated herein by reference.

Referring again to FIGS. 2A and 2B, a backstop or insulator shield 6a made of an insulating and preferably shock-absorbing material is provided between contact pad 4 and the top surface of top transducer frame 8a. Insulating shield 6a also acts a slide bearing surface for contact pad 4. To mechanically couple contact pad 4 with transducer 30, cut-outs or thru-holes 18 are provided within backstop 6a and thru-holes 28 are provided within discs 20a and 20b as well as within dielectric film 26 to receive and accommodate protrusions or pins 16 extending from the underside 4b of contact pad 4. The thru-holes 28 within the transducer component layers may also serve to receive a means (not shown), e.g., bolts, threaded bosses, for mechanically coupling the layers together. Optionally, a bottom backstop or shield 6b may be provided on the bottom side of transducer frame 8b to provide mechanical stability as well as to act as an additional shock absorber.

The bottom side of sensory feedback device 2 includes a plate 12 which provides mechanical stability to device 2 by way of a mechanical coupling (not shown), e.g., bolts, which are placed in thru-holes 24 within each of the above described layers of device 2. Plate 12 also functions as an electrical adaptor having electrical traces or contacts 14a, 14b, 14c, which may be in the form a printed circuit board housed within the user interface device, for electrical communication with the control electronics and a source of power (discussed in greater detail below). The exemplary pattern of electrical traces includes traces 14a and 14b for connection to each of the two designate high voltage electrodes and a single trace 14c for connection to both of the grounded electrodes.

Figure 4:
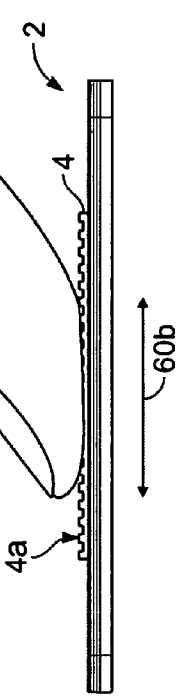
FIG. 4 illustrates a side view of the sensory feedback device of FIGS. 1A-1C with a human finger in operative contact with the contact surface of the device.

With its overall very low-profile and square shape, the sensory/haptic feedback devices of the present invention are particularly suitable for use in a keyboard, touch screen, computer mouse and other user interface devices where only a single finger 38 is used to contact the input portion of the device, as illustrated in FIG. 4. However, those skilled in the art will appreciate other configurations that are suitable for user interface devices designed for contact by a user's palm or with a hand grip, such as trackballs, stylus sticks, joysticks, etc.

With the electrode configuration described above (i.e., two working electrode pairs), transducer 10 is capable of functioning in either a single or a two-phase mode. In the manner configured, the mechanical displacement of the output component, i.e., the two coupled discs 20a and 20b, of the subject sensory feedback device described above has is lateral rather than vertical. In other words, instead of the sensory feedback signal being a force in a direction perpendicular to the contact surface 4a of the user interface pad 4 and parallel to the input force (designated by arrow 60a in FIG. 4) applied by the user's finger 38 (but in the opposing or upward direction), the sensed feedback or output force (designated by double-head arrow 60b in FIG. 4) of the sensory/haptic feedback devices of the present invention is in a direction parallel to the contact surface 4a and perpendicular to input force 60a. Depending on the rotational alignment of the electrode pairs about an axis perpendicular to the plane of transducer 10 and relative to the position of the user interface pad 4, e.g., a keyboard key pad, and the mode in which the transducer is operated (i.e., single phase or two phase), this lateral movement may be in any direction or directions within 360°. For example, the lateral feedback motion may be from side to side or up and down (both are two-phase actuations) relative to the forward direction of the user's finger (or palm or grip, etc.). While those skilled in the art will recognize certain other actuator configurations which provide a feedback displacement which is transverse or perpendicular to the contact surface of the haptic feedback device, the overall profile of a device so configured may be greater than the aforementioned design.

Figure 5A:
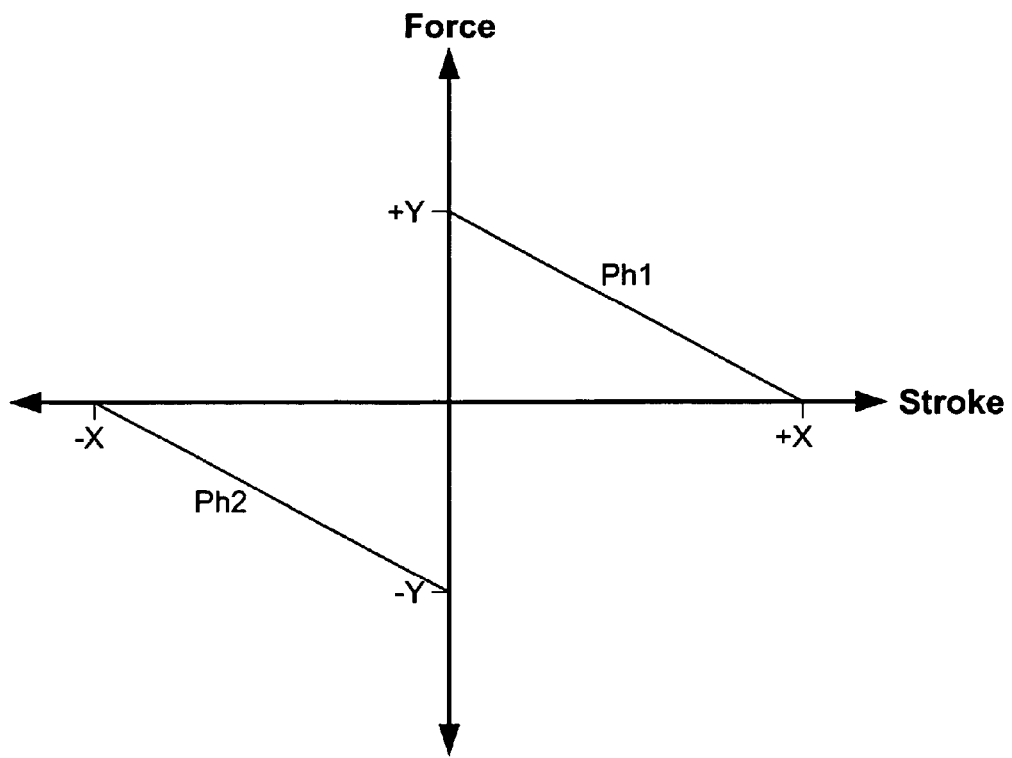
FIGS. 5A and 5B graphically illustrate the force-stroke relationship and voltage response curves, respectively, of the actuator of FIGS. 3A-3C when operated in a single-phase mode.
Figure 5B:
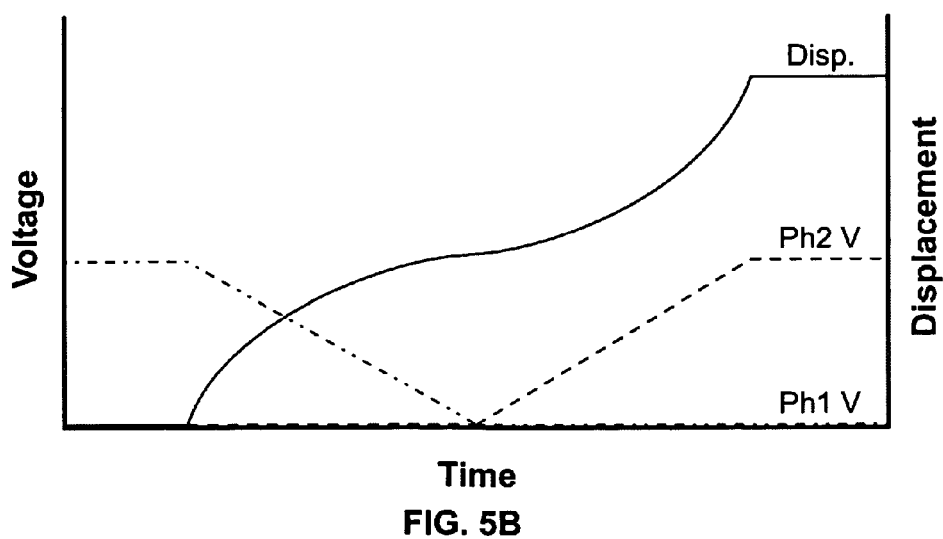

When operating sensory/haptic feedback device 2 in single-phase mode, only one working pair of electrodes of actuator 30 would be activated at any one time. The single-phase operation of actuator 30 may be controlled using a single high voltage power supply. As the voltage applied to the single-selected working electrode pair is increased, the activated portion (one half) of the transducer film will expand, thereby moving the output disc 20 in-plane in the direction of the inactive portion of the transducer film. FIG. 5A illustrates the force-stroke relationship of the sensory feedback signal (i.e., output disc displacement) of actuator 30 relative to neutral position when alternatingly activating the two working electrode pairs in single-phase mode. As illustrated, the respective forces and displacements of the output disc are equal to each other but in opposite directions. FIG. 5B illustrates the resulting non-linear relationship of the applied voltage to the output displacement of the actuator when operated in this single-phase mode. The "mechanical" coupling of the two electrode pairs by way of the shared dielectric film may be such as to move the output disc in opposite directions. Thus, when both electrode pairs are operated, albeit independently of each other, application of a voltage to the first working electrode pair (phase 1) will move the output disc 20 in one direction, and application of a voltage to the second working electrode pair (phase 2) will move the output disc 20 in the opposite direction. As the various plots of FIG. 5B reflect, as the voltage is varied linearly, the displacement of the actuator is non-linear.

Figure 6A:
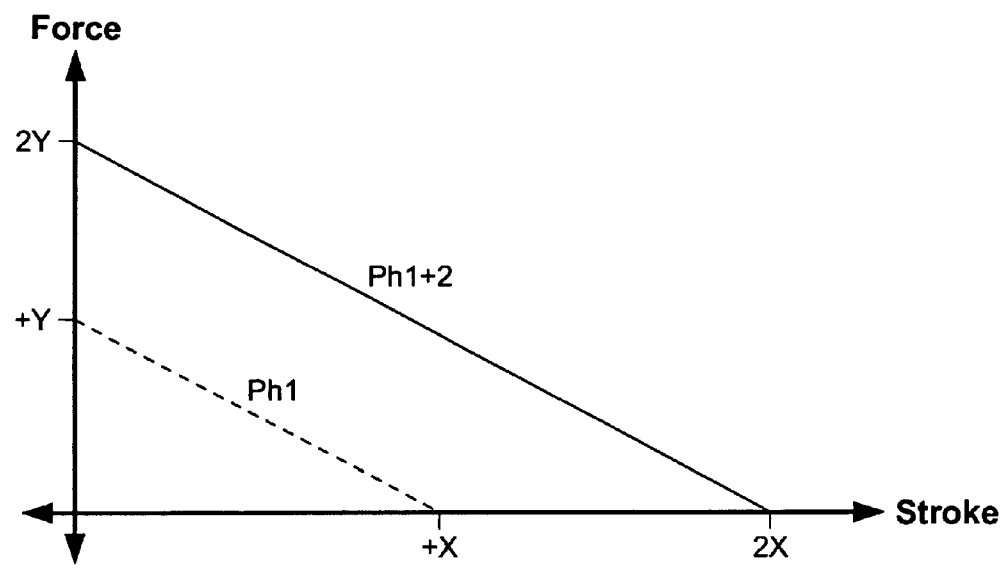
FIGS. 6A and 6B graphically illustrate the force-stroke relationship and voltage response curves, respectively, of the actuator of FIGS. 3A-3C when operated in a two-phase mode.
Figure 6B:
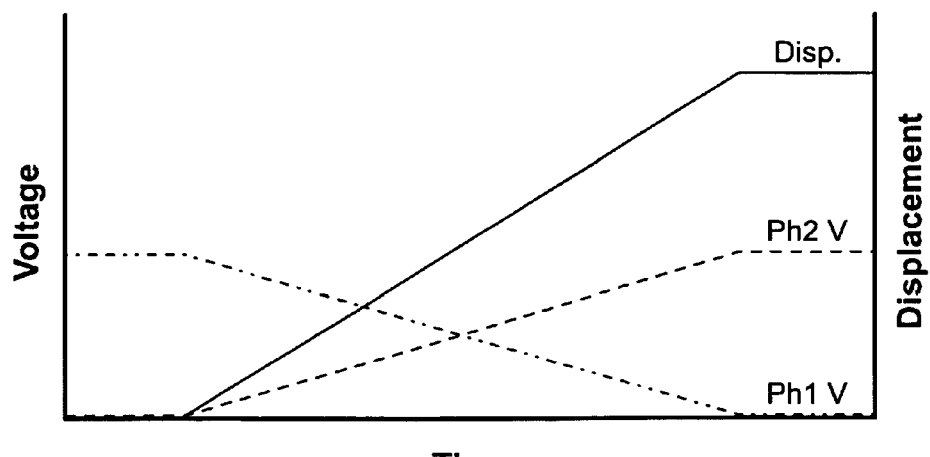
Figure 7:
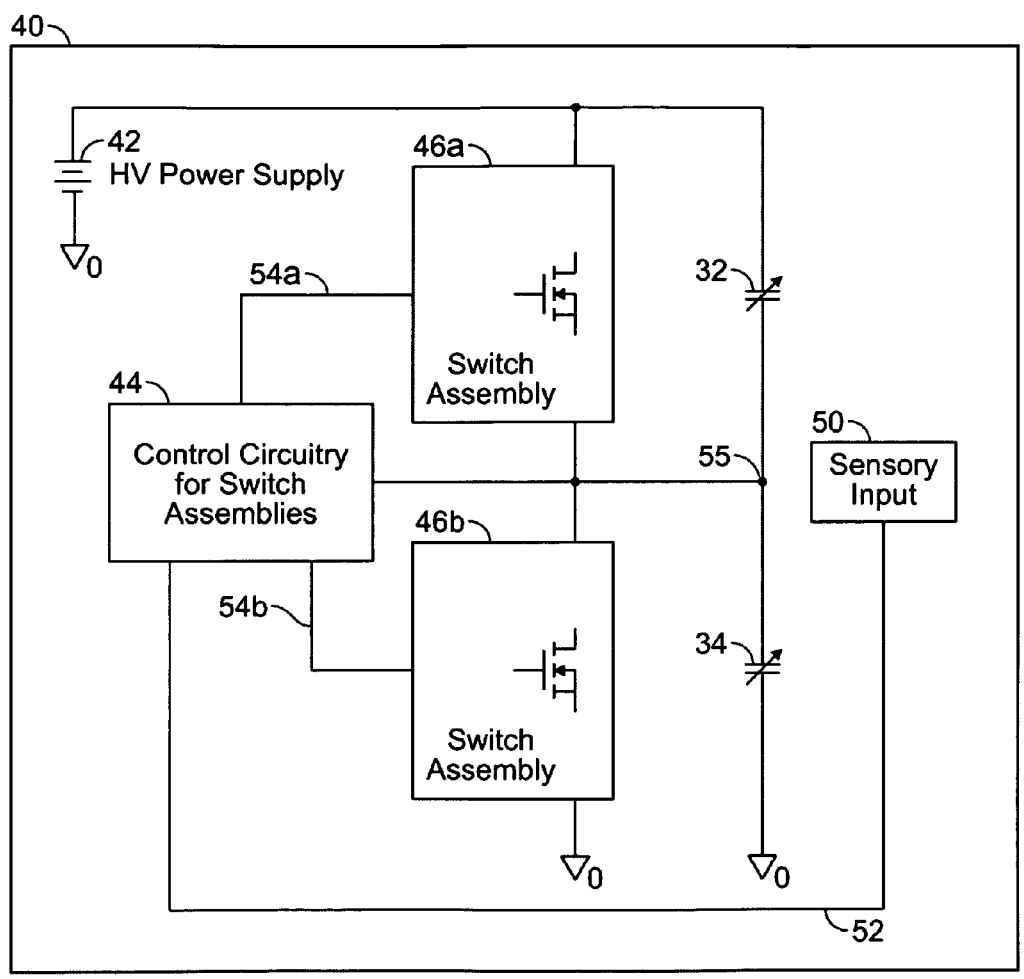
FIG. 7 is a block diagram of electronic circuitry, including a power supply and control electronics, for operating the sensory feedback device of FIGS. 1A-1C.

To effect a greater displacement of the output member or component, and thus provide a greater sensory feedback signal to the user, actuator 30 is operated in a two-phase mode, i.e., activating both portions of the actuator simultaneously. FIG. 6A illustrates the force-stroke relationship of the sensory feedback signal of the output disc when the actuator is operated in two-phase mode. As illustrated, both the force and stroke of the two portions 32, 34 of the actuator in this mode are in the same direction and have double the magnitude than the force and stroke of the actuator when operated in single-phase mode. FIG. 6B illustrates the resulting linear relationship of the applied voltage to the output displacement of the actuator when operated in this two-phase mode. By connecting the mechanically coupled portions 32, 34 of the actuator electrically in series and controlling their common node 55, such as in the manner illustrated in the block diagraph 40 of FIG. 7, the relationship between the voltage of the common node 55 and the displacement (or blocked force) of the output member (in whatever configuration) approach a linear correlation. In this mode of operation, the non-linear voltage responses of the two portions 32, 34 of actuator 30 effectively cancel each other out to produce a linear voltage response. With the use of control circuitry 44 and switching assemblies 46a, 46b, one for each portion of the actuator, this linear relationship allows the performance of the actuator to be fine-tuned and modulated by the use of varying types of waveforms supplied to the switch assemblies by the control circuitry. Another advantage of using circuit 40 is ability to reduce the number of switching circuits and power supplies needed to operate the sensory feedback device. Without the use of circuit 40, two independent power supplies and four switching assemblies would be required. Thus, the complexity and cost of the circuitry are reduced while the relationship between the control voltage and the actuator displacement are improved, i.e., made more linear.

Various types of mechanisms may be employed to communicate the input force 60a from the user to effect the desired sensory feedback 60b (see FIG. 4). For example, a capacitive or resistive sensor 50 (see FIG. 7) may be housed within the user interface pad 4 to sense the mechanical force exerted on the user contact surface input by the user. The electrical output 52 from sensor 50 is supplied to the control circuitry 44 which in turn triggers the switch assemblies 46a, 46b to apply the voltage from power supply 42 to the respective transducer portions 32, 34 of the sensory feedback device in accordance with the mode and waveform provided by the control circuitry.

Figure 8:
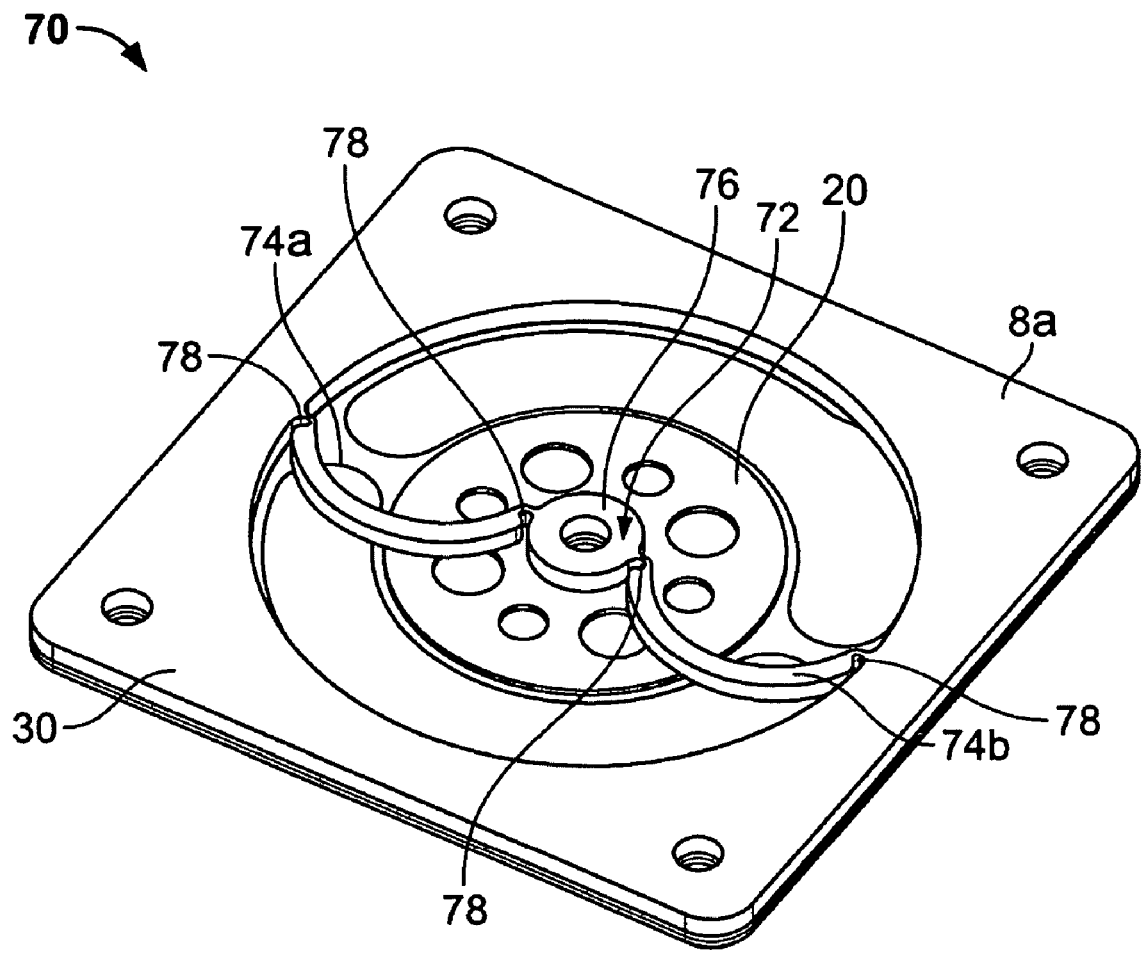
FIG. 8 illustrates an alternate bi-stable embodiment of a sensory feedback device of the present invention.

Referring now to FIG. 8, there is illustrated another actuator embodiment 70 of the present invention for use in a sensory/haptic feedback device of the present invention. Actuator 70 includes the same basic actuator structure 30 described above with the inclusion of a mechanism 72 which imposes a negative spring rate bias on output disc 20. Negative spring rate mechanism 72 includes a central hub 76 mechanically coupled to output disc 20 and two opposing leaf spring flexures 74a and 74b extending between hub 76 and a frame side 8a of the actuator. The flexures 74a, 74b are each coupled to the hub and frame by living spring joints 78. Whether operated in single-phase or two-phase mode, the actuator is inherently bi-stable. An advantage of negative biasing, at least in the context of the subject actuators, is that as the displacement/stroke distance of the output element increases, significantly less force is need to achieve a greater stroke distance. The force-stoke relationship of negative force biasing is described in detail in U.S. patent application Ser. No. 11/618,577, which is herein incorporated by reference in its entirety.

Another variation of the present invention involves the hermetic sealing of the EAP actuators to minimize any effects of humidity or moisture condensation that may occur on the EAP film. For the various embodiments described below, the EAP actuator is sealed in a barrier film substantially separately from the other components of the tactile feedback device. The barrier film or casing may be made of, such as foil, which is preferably heat sealed or the like to minimize the leakage of moisture to within the sealed film. Each of these device embodiments enables coupling of the feedback motion of the actuator's output member to the contact surface of the user input surface, e.g., keypad, while minimizing any compromise in the hermetically sealed actuator package. Various exemplary means for coupling the motion of the actuator to the user interface contact surface are also provided.

Figure 9A:
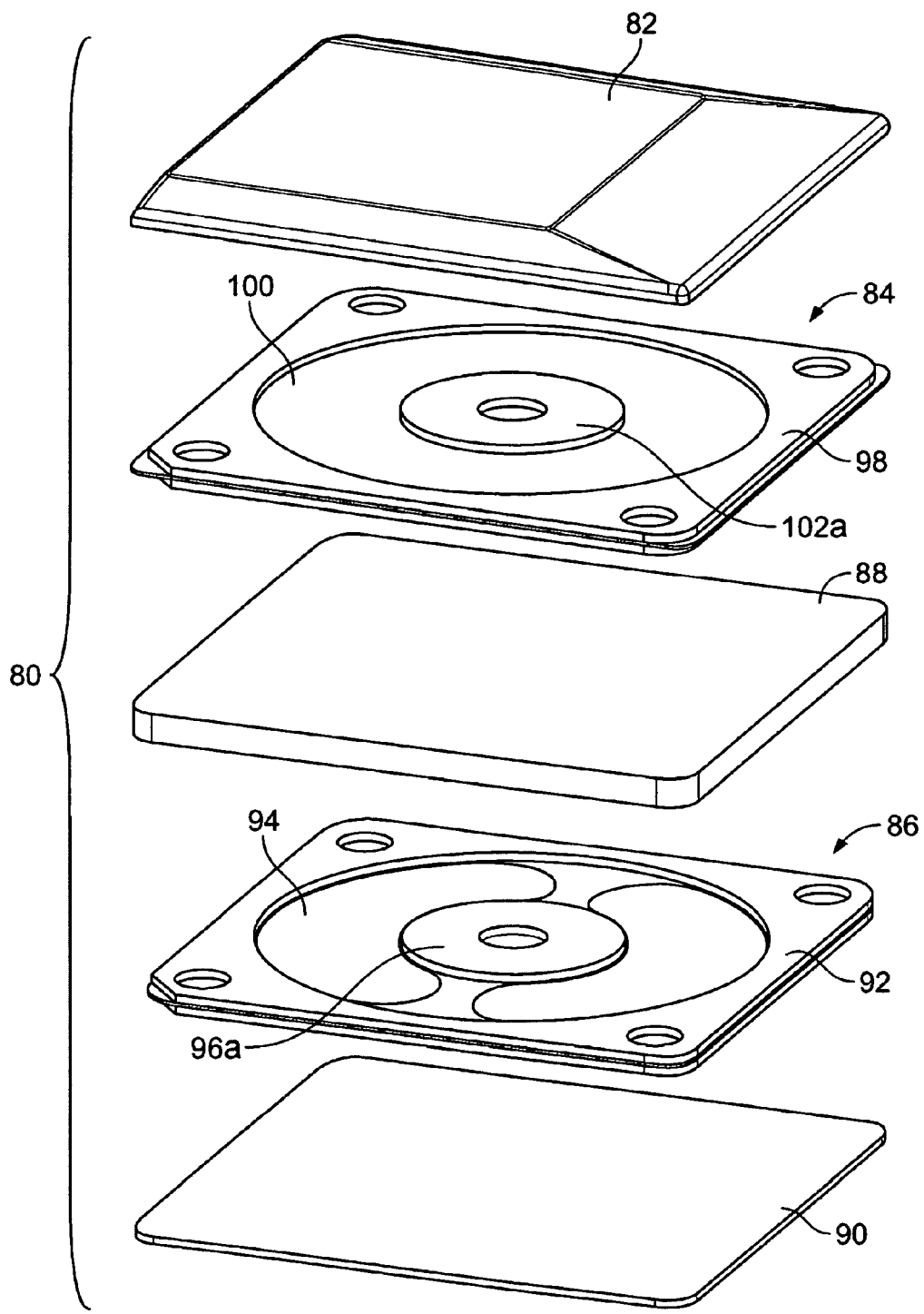
FIGS. 9A and 9B show exploded top and bottom perspective views, respectively, of another tactile feedback device of the present invention in which magnets are used to couple the actuator to the contact surface of the device.
Figure 9B:
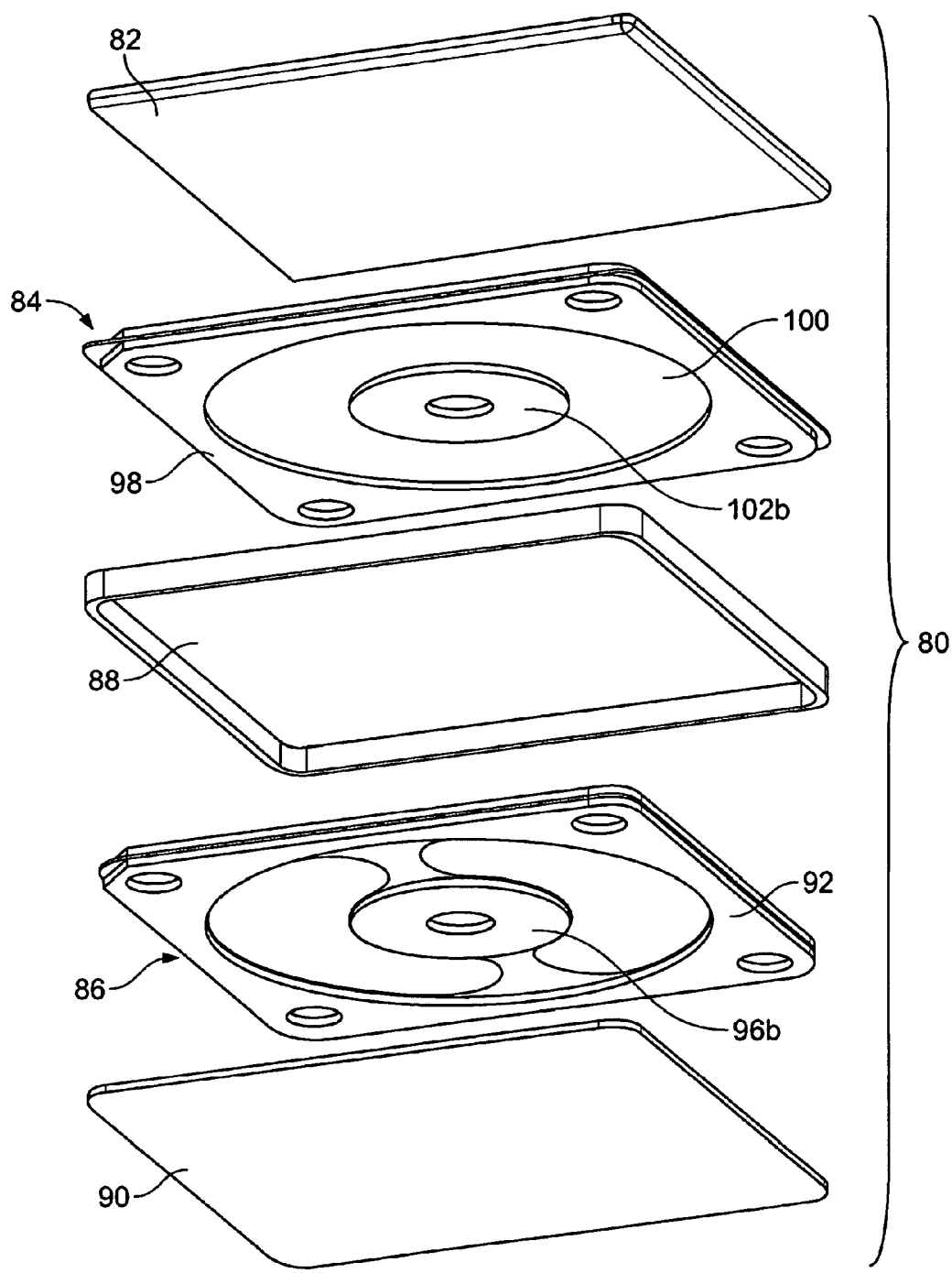

One such coupling means involves the use of magnets. FIGS. 9A and 9B illustrate a tactile feedback device employing such magnetic coupling. Device 80 includes user interface key cap 82 and EAP actuator 86, where the actuator is optionally hermetically sealed by top and bottom covers 88 and 90 which are made of magnetically inert, rigid materials. The key cap and actuator components are coupled by means of opposing magnetic units. A first magnetic unit 96a/b is provided centrally suspended within EAP film 84 held by frame 92. This magnetic unit, in essence, acts as the output member of actuator 86 and is displaced laterally or in-plane, as discussed above, upon actuation of the actuator. The second magnetic unit 102a/b is held by another cartridge 84, similarly constructed and sized to the actuator cartridge 86 in that a film 100 is held stretched within an open frame 98 with the magnetic unit held centrally suspended therein; however, unlike EAP film 84, film 100 is passive, i.e., has no electrodes. Key pad 82 or at least its underside is made of a material that is attractable to magnetic unit 102, thereby fixing the key pad to suspension cartridge 98. Both magnetic units are typically disc-shaped and may comprise a single magnet or a pair of stacked magnetic discs. In the latter arrangement, as illustrated in the FIGS. 9A and 9B, the two magnets of each pair (96a, 96b and 102a, 102b) may be oppositely polarized and thereby fixed together. The opposing suspension and actuator magnetic units may either be oppositely polarized or similarly polarized. When oppositely polarized (i.e., N-S), the magnetic units 96, 102 attract each other (through top sealing layer 88) and, thus, move in parallel/tandem upon actuation of actuator 92, i.e., the feedback motion of the keypad is in the same planar direction as that of the displacement output of the actuator. When the magnetic units 96, 102 have he same polarization (i.e., either N-N or S-S), they repel each other resulting in the units moving both vertically and horizontally away from each other, i.e., the feedback motion of the keypad is in the opposite direction as that of the displacement output of the actuator. In the latter arrangement, the respective films 94, 100 must have sufficient suspension to counter the displacement of the magnetic units caused by the repulsion. An advantage of the repelling arrangement over the attracting arrangement is that it reduces the friction between the magnets and casing 88.

Figure 10A:
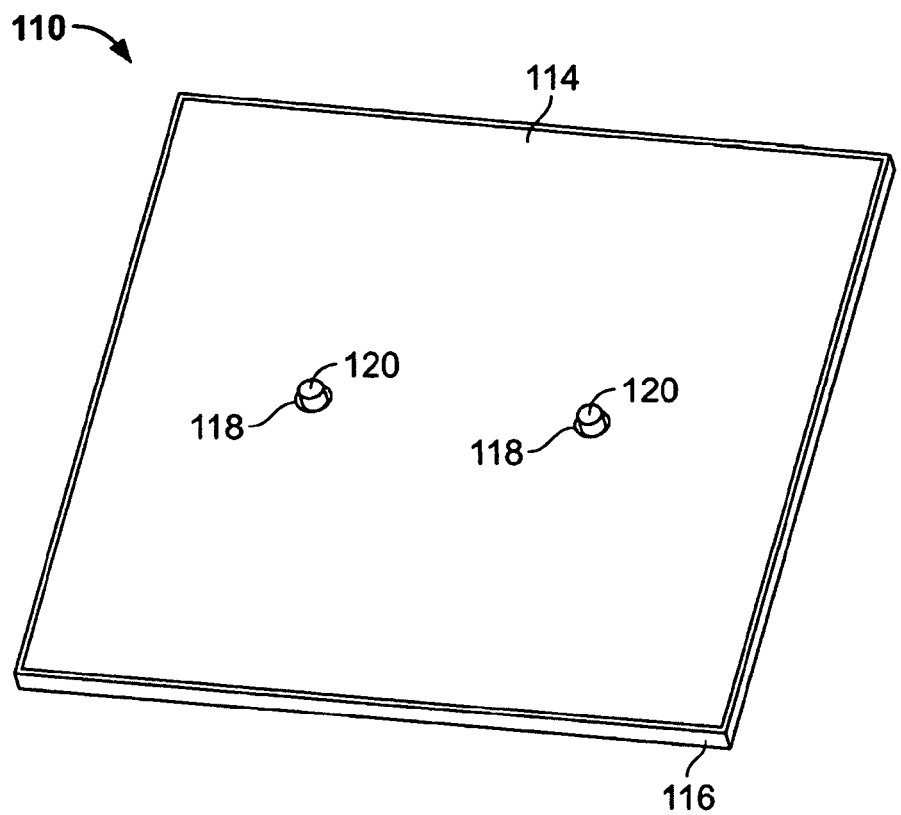
FIGS. 10A and 10B illustrate perspective assembled and exploded views, respectively, of a hermetically sealed electroactive polymer actuator of the present invention for use in the tactile feedback devices of the present invention.
Figure 10B:
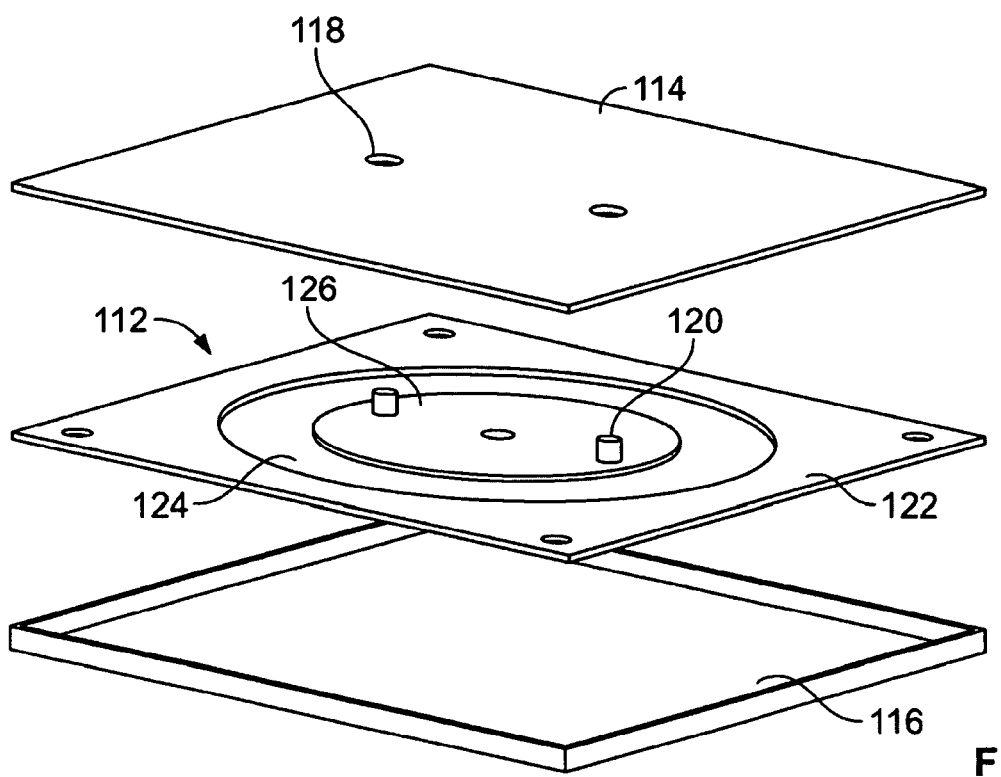

Another embodiment of a sealed actuator is illustrated in FIGS. 10A and 10B. Actuator package 110 includes actuator cartridge 112 sealed between a top and base barriers 114, 116. Actuator cartridge 112 includes open frame 122 having an EAP film 124 stretched between it and a centrally positioned output disc 126. Two (or more) protrusions or pins 120 extend from atop output disc 126 and extend through corresponding holes 118 within top sealing barrier 114 for mechanical coupling to a user input key (not shown). As such, movement of output disc 126, i.e., in the planar direction as configured, in turn translates the user input key. Mounted circumferentially about pins 120 or within holes 118 is a compliant barrier film, such as styrene-ethylene-butadiene-styrene (SEBS) block copolymer, in the form of a ring to provide an elastic and flexible seal therebetween. As such, the pins provide a bridge between the actuator and user interface pad that does not disrupt the hermetic seal about the actuator.

Figure 11A:
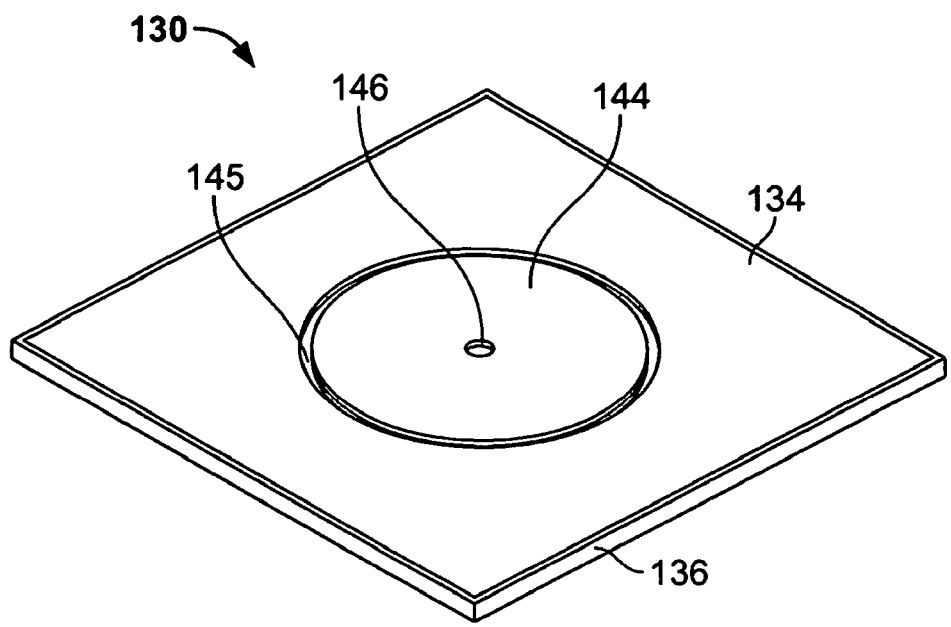
FIGS. 11A and 11B illustrate perspective assembled and exploded views, respectively, of another hermetically sealed electroactive polymer actuator of the present invention for use in the tactile feedback devices of the present invention.
Figure 11B:
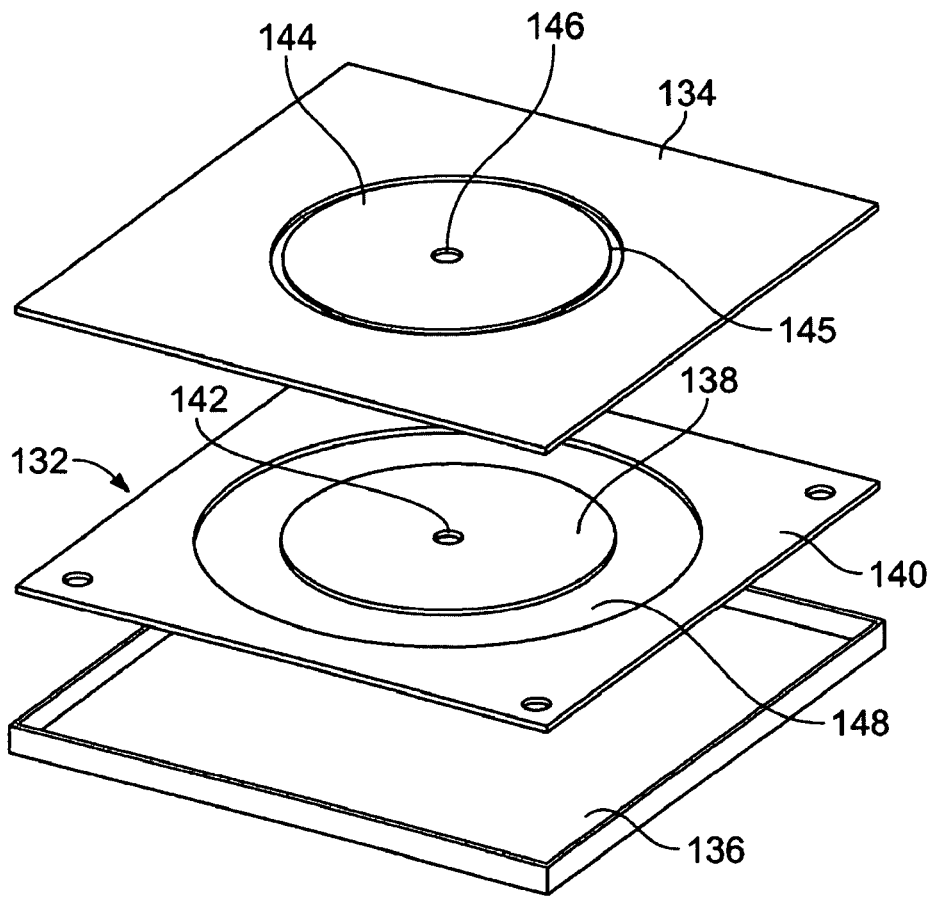

FIGS. 11A and 11B illustrate another sealed actuator package 130 having an actuator cartridge 132 sealed between top and base barriers 134, 136. Actuator cartridge 132 has an open frame 140 and an EAP film 148 stretched between it and a centrally positioned output disc 138. Top barrier 134 has a central section 144 having a shape and diameter substantially matching that of output disc 138. The gap or spacing 145 between the central section 144 and the outer portion of barrier 134 holds a compliant film material, SEBS block copolymer, to allow movement of the central portion without compromising the sealed actuator. Centrally disposed holes 142 and 146, respectively, within each of the actuator output member 138 and barrier film section 144 are aligned to provide a thru hole for receiving a pin, screw or the like for coupling the actuator output motion to a user input member (not shown).

Figure 12A:
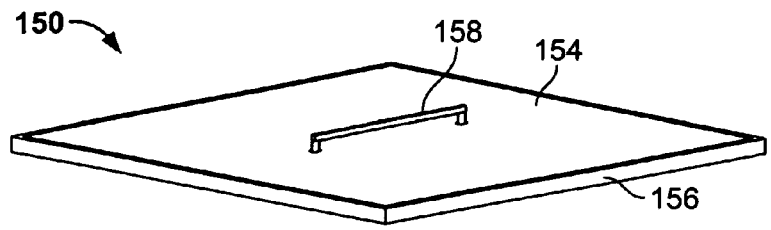
FIGS. 12A-12C illustrate assembled, exploded and cross-sectional views, respectively, of another hermetically sealed electroactive polymer actuator of the present invention for use in the tactile feedback devices of the present invention.
Figure 12B:
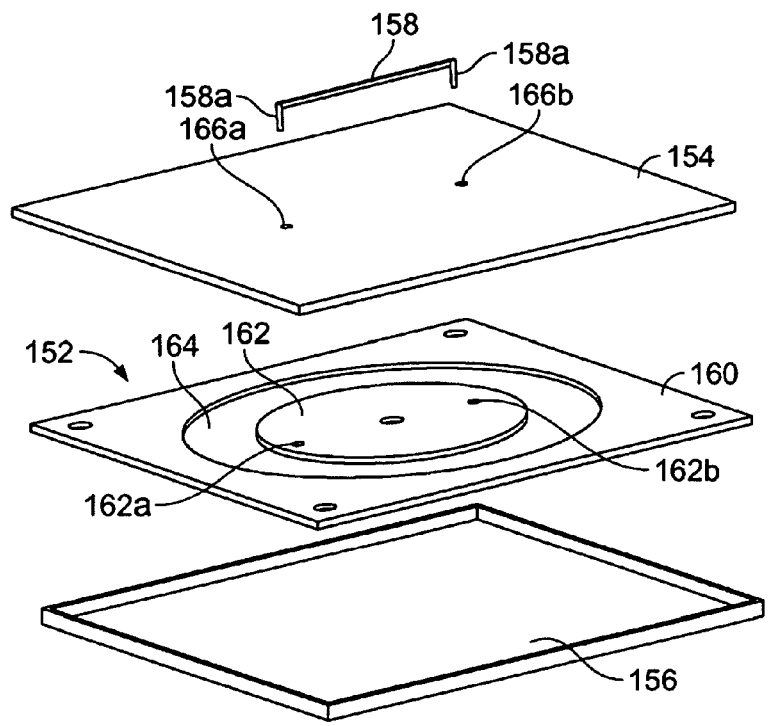
Figure 12C:
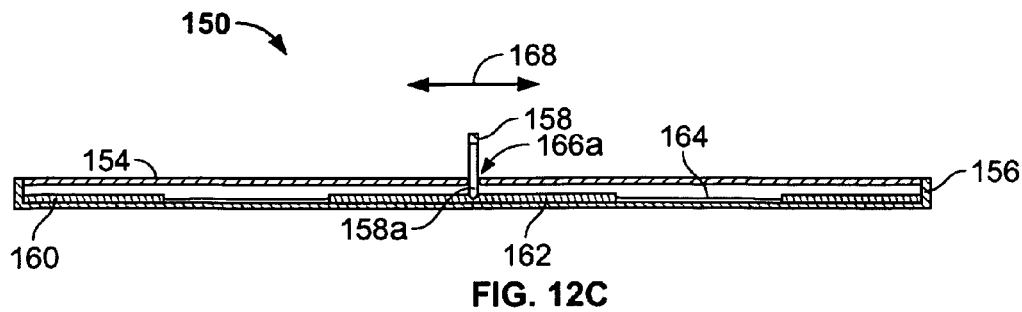

FIGS. 12A-12C illustrate another sealed actuator 150 of the present invention. Actuator package 150 includes actuator cartridge 152 sealed between a top and base barriers 154, 156. Actuator cartridge 152 includes open frame 160 having an EAP film 164 stretched between it and a centrally positioned output disc 162. Two diametrically opposing pin holes extend through top barrier 154 (166a, 166b) and output disc 162 (162a, 162b) for receiving the legs 158a of a lever bar 158. The holes 166a, 166b are countersunk (best illustrated in FIG. 12C) to allow the pins 158a to pivot therein. As such, when actuator 152 is activated with the resulting planar translation of output disc 162, the pins are caused to pivot about the fulcrum defined by the countersunk holes 168a, 168b. The resulting movement of lever bar 158, illustrated by arrows 168 in FIG. 12C, is in a direction perpendicular to the alignment of the bar. The countersunk configuration of these holes allows a close fit between the lever legs and the holes within the top barrier so as to form a seal. Optionally, the legs may be coated with a compliant material to provide a more hermetically sealed environment.

Figure 13A:
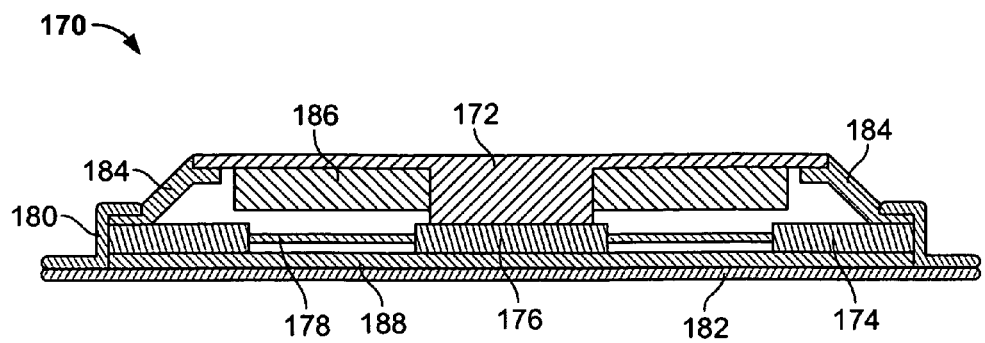
FIGS. 13A-13C illustrate another haptic feedback device of the present invention employing another variation of a hermetically sealed actuator.
Figure 13B:
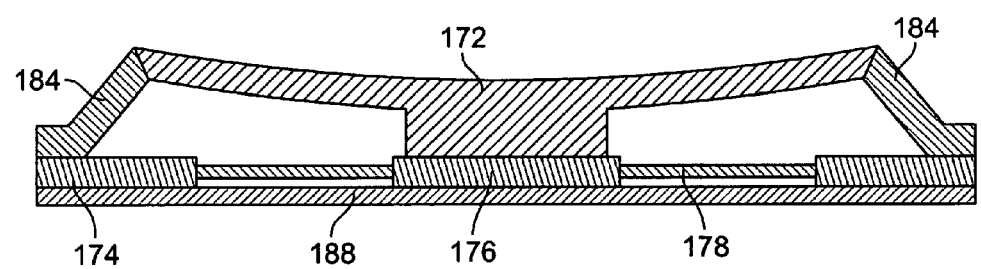
Figure 13C:
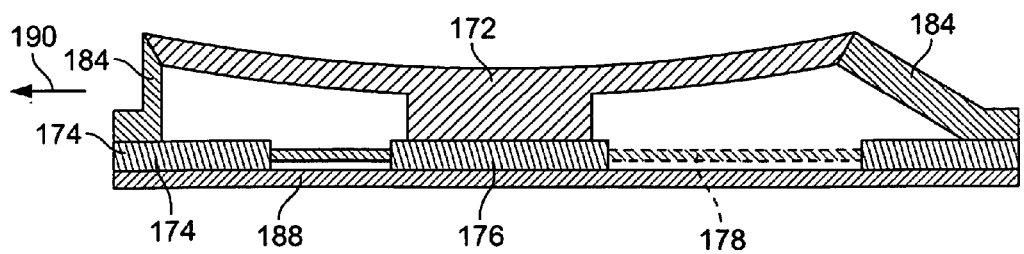

FIG. 13A illustrates another manner of hermetically sealing the actuator employed in a haptic feedback device 170 of the present invention. The actuator includes open frame 174, output disc 176 and EAP film 178 extending therebetween. The actuator is positioned atop a back plate 188 and beneath a keypad 172. Extending about the perimeter of the keypad 172 and between the keypad and actuator frame 174 is a vapor barrier membrane or gasket 184. Membrane may be molded from SEBS, Butyl, or the like. The outer edge of the assembly, including barrier membrane 184, is encased by a sealed packaging 182, which may comprise top and bottom foil layers 180, 182 or the like which are heat sealed together. Optionally, a desiccant or buffer 186 may be positioned within the space between the keypad and the actuator. FIGS. 13B and 13C illustrate device 170 (shown without the desiccant and foil packaging for clarity) when the actuator component is in passive and active states, respectively. In the passive state (FIG. 13B), like the actuator EAP film 178, the barrier membrane 184 has a symmetrical configuration about key pad 172. In the active state (FIG. 13C), the EAP film is selectively activated and/or configured such that output disc 176 moves laterally in one direction, as indicated by arrow 190. In turn, keypad 172 is caused to move in the same direction. The barrier film material 184 is able to stretch and compress to accommodate the movement of keypad 172.

The actuators of the present invention may be provided in a planar array fabricated by continuous web-based manufacturing techniques. Such arrays are highly practical as sensory/haptic feedback devices are often provided in array formats themselves. A computer keyboard is a common example of such. FIGS. 14-17 illustrate arrays of various components of the haptic devices of the present invention at various points in the web fabrication process.

Figure 14A:
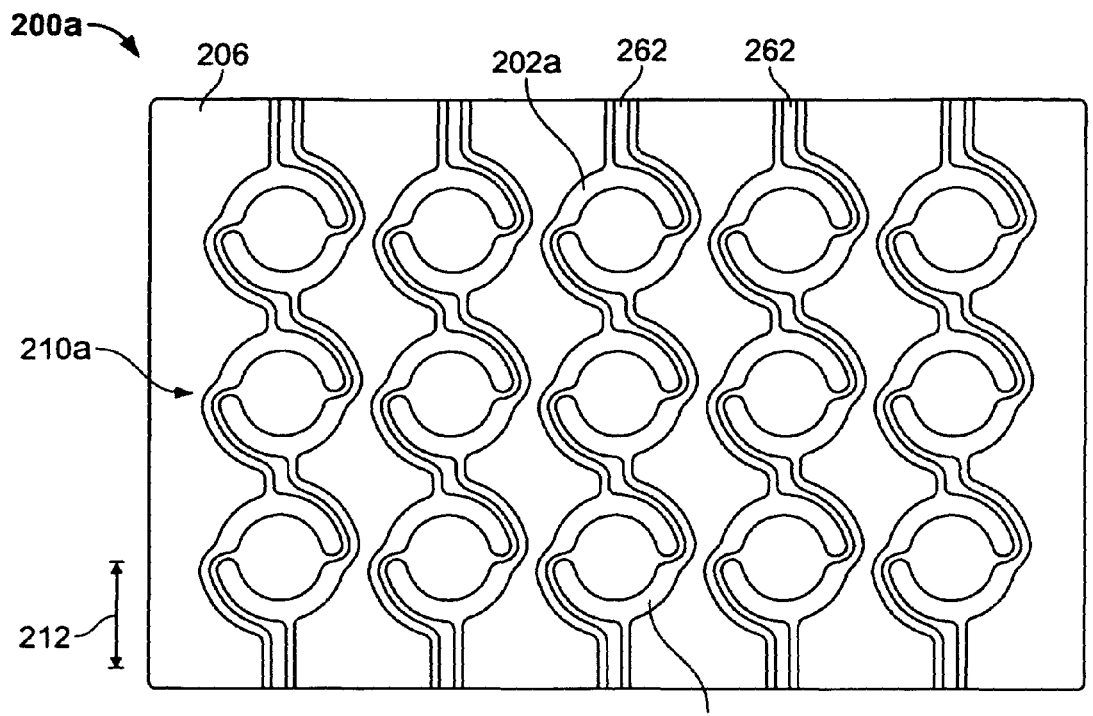
FIGS. 14A and 14B illustrate arrays, respectively, of electrode patterns disposed on opposite sides of a dielectric film material for use in an array of haptic feedback devices of the present invention.
Figure 14B:
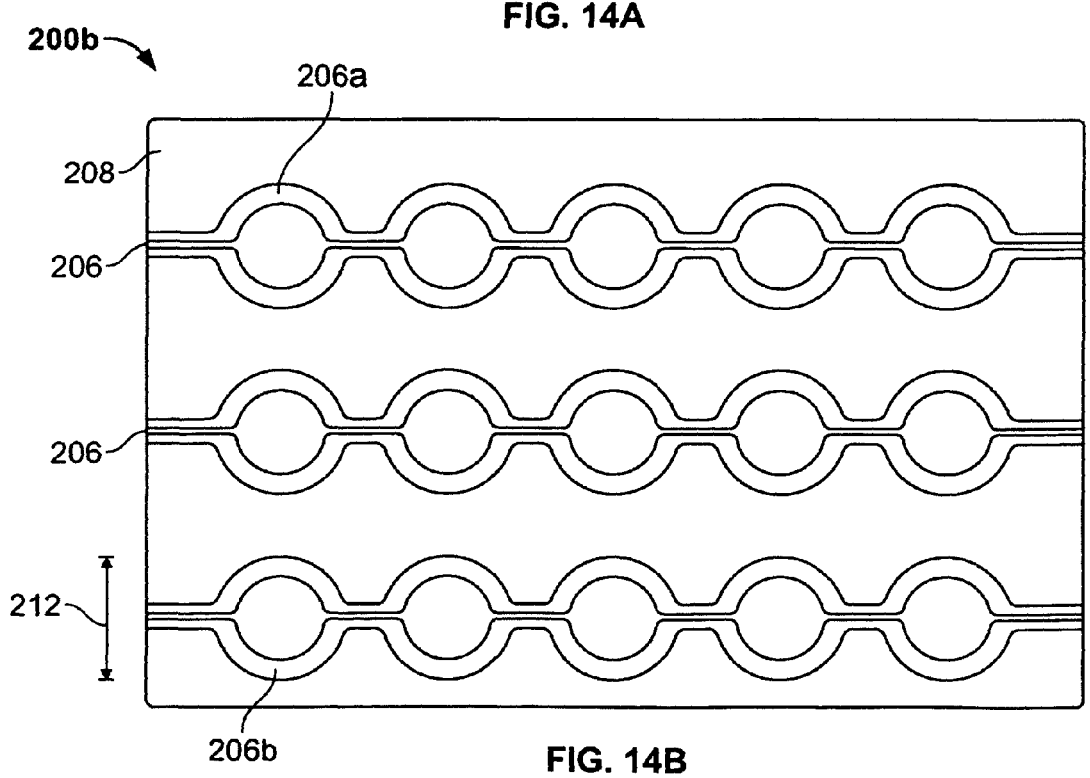
Figure 15:
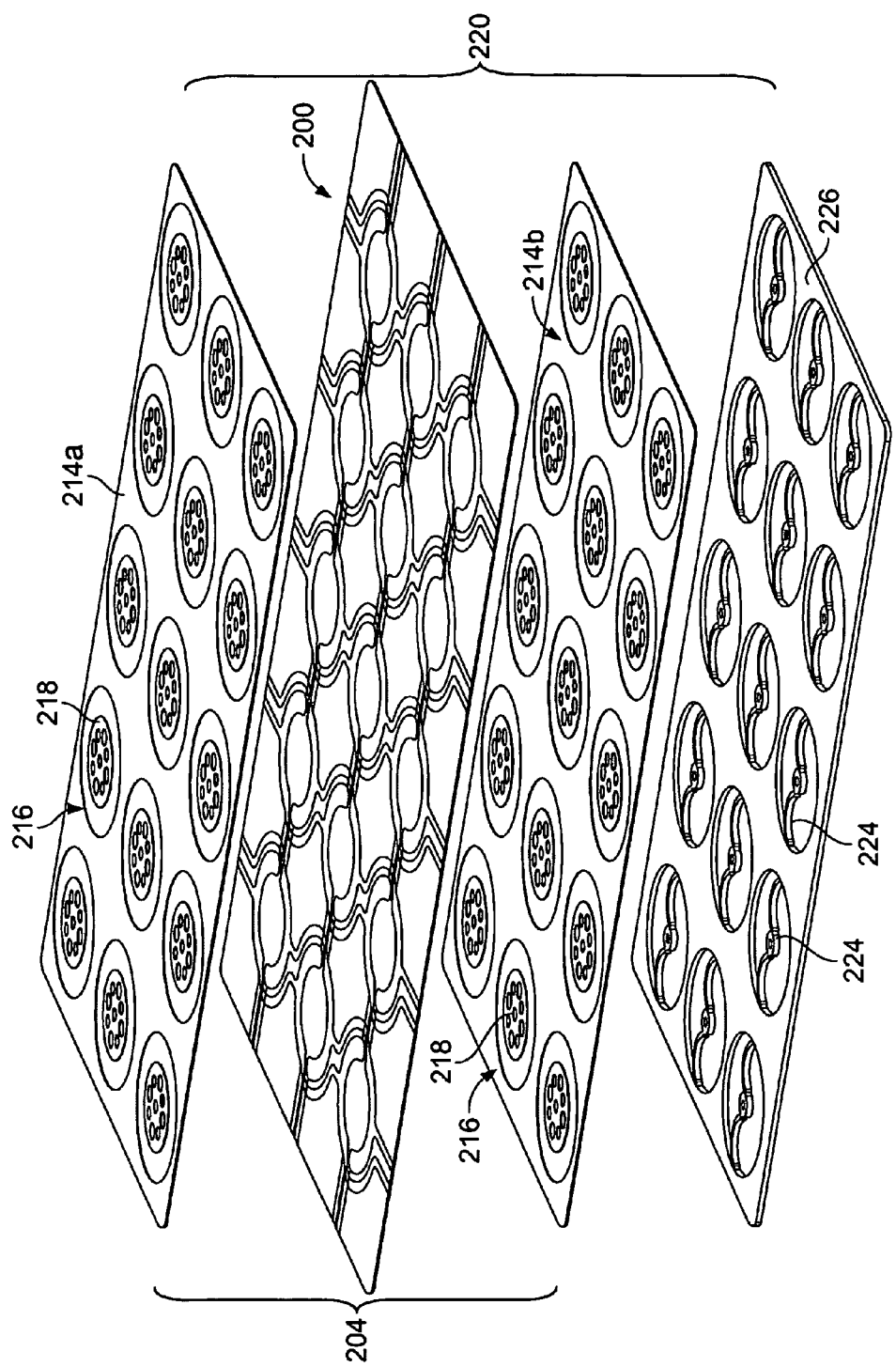
FIG. 15 is an exploded view of an array of actuators for use in the sensory feedback devices of the present invention.
Figure 16:
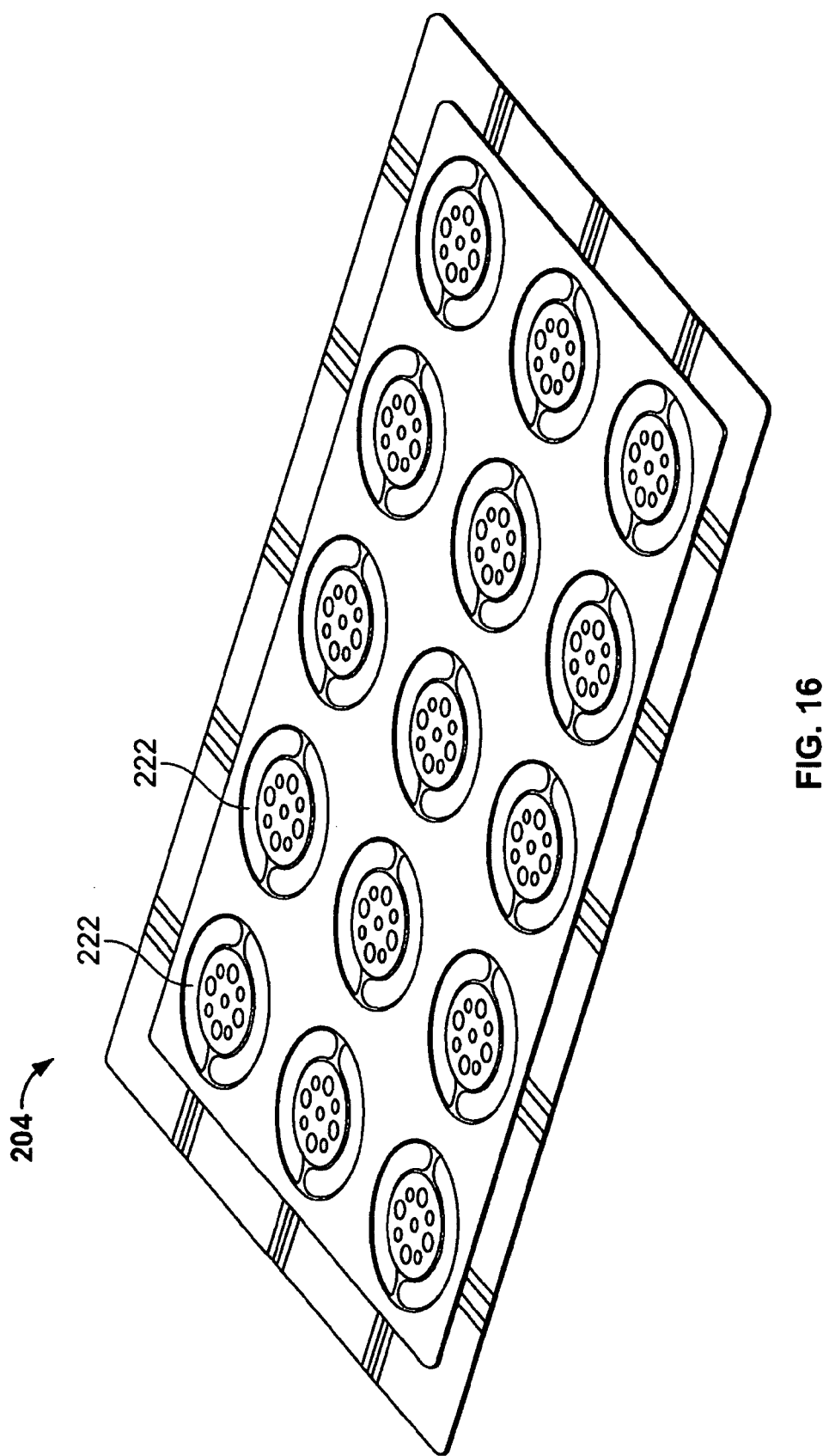
FIG. 16 is an assembled view of an array of actuators of the type illustrated in FIGS. 3A-3C.
Figure 17:
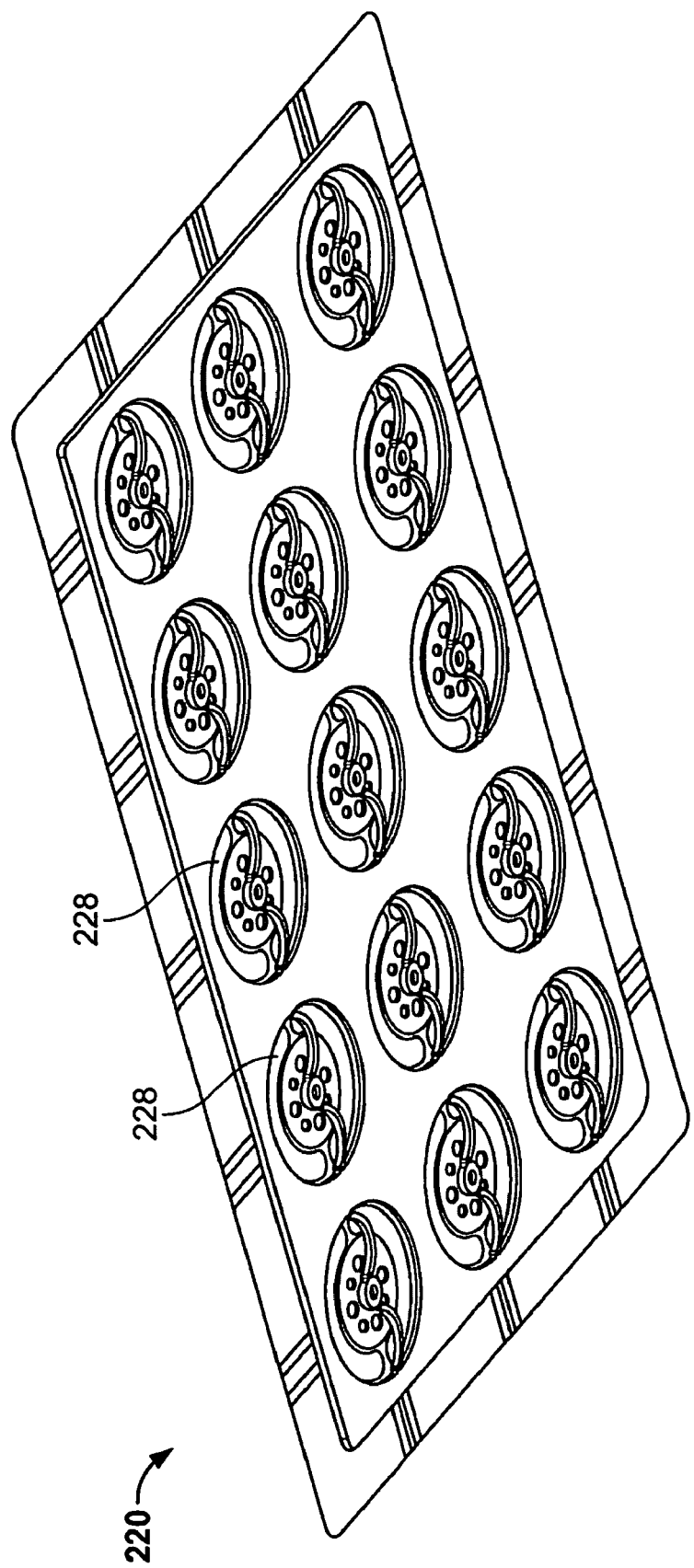
FIG. 17 is an assembled view of an array of actuators of the type illustrated in FIG. 8.

FIGS. 14A and 14B illustrate high voltage and ground sides 200a and 200b, respectively, of an EAP film array 200 (see FIG. 15) for use in an array of EAP actuators for use in the tactile feedback devices of the present invention. Film array 200 includes an electrode array provided in a matrix configuration to increase space and power efficiency. The high voltage side 200a of the EAP film array provides electrode patterns 202 running in vertically (according to the view point illustrated in FIG. 14A) on dielectric film 208 material. Each pattern 202 includes a pair of high voltage lines 202a, 202b. The opposite or ground side 200b of the EAP film array provides electrode patterns 206 running transversally relative to the high voltage electrodes, i.e., horizontally. Each pattern 206 includes a pair of ground lines 206a, 206b. Each pair of opposing high voltage and ground lines (202a, 206a and 202b, 206b) provides a separately activatable electrode pair such that activation of the opposing electrode pairs provides a two-phase output motion in the directions illustrated by arrows 212. The assembled EAP film array 200 (illustrating the intersecting pattern of electrodes on top and bottom sides of dielectric film 208) is provided in FIG. 15 within an exploded view of an array 204 of EAP transducers 222, the latter of which is illustrated in its assembled form in FIG. 16. EAP film array 200 is sandwiched between opposing frame arrays 214a, 214b, with each individual frame segment 216 within each of the two arrays defined by a centrally positioned output disc 218 within an open area. Each combination of frame/disc segments 216 and electrode configurations form an EAP transducer 222. Depending on the application and type of actuator desired, additional layers of components may be added to transducer array 204. For example, to form an array of the bi-stable EAP actuators of FIG. 8, an additional array layer 226 of negative spring rate flexures 224 is provided on one side of the transducer array 204. The complete transducer layer 220 having an array of EAP transducers 228 is illustrated in exploded and assembled views in FIGS. 15 and 17, respectively. The transducer array 220 may be incorporated in whole to a user interface array, such as a keyboard, for example, or the individual transducers 228 may be singulated for use in individual user interface devices, such as individual keypads, for example.

Regarding methodology, the subject methods may include each of the mechanical and/or activities associated with use of the devices described. As such, methodology implicit to the use of the devices described forms part of the invention. Other methods may focus on fabrication of such devices.

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth n the claims. Stated otherwise, unless specifically defined herein, all technical and scientific terms used herein are to be given as broad a commonly understood meaning as possible while maintaining claim validity.

In all, the breadth of the present invention is not to be limited by the examples provided.

That being said, we claim:

1. A user interface device having sensory feedback comprising:
    a user contact surface;
    an electroactive polymer transducer comprising an output member coupled to the contact surface;
    a sensor for sensing a mechanical force on the user contact surface and providing an activation signal to the transducer,
    at least one pin extending between the output member and the user contact surface;
    a compliant material between the pin and the sealing material;
    and a scaling material adapted to substantially hermetically seal the transducer, wherein activation of the transducer moves at least a portion of the user contact surface, wherein the output member is mechanically coupled to the user contact surface, and wherein the at least one pin extends through the sealing material.

2. The user interface device of claim 1, wherein the movement of the contact surface is in a lateral direction.

3. The user interface device of claim 1, wherein the user contact surface comprises a keypad.

4. The user interface device of claim 1, wherein the sealing material comprises a countersunk hole for receiving a pin.

5. The user interface device of claim 4, wherein the at least one pin extends from a pivotable lever.

6. The user interface device of claim 1, wherein the output member is magnetically coupled to the user contact surface.

7. The user interface device of claim 1, wherein the transducer comprises an electroactive polymer film extending between the output member and an open frame.

8. The user interface device of claim 1, wherein the transducer further comprises a negative spring rate bias mechanism associated with the output member.

9. The user interface device of claim 1, wherein the sealing material forms a gasket between the user contact surface and the transducer.

10. The user interface device of claim 1, wherein the sealing material encases the transducer.

11. The user interface device of claim 1, wherein the transducer is activatable in two phases.

12. The user interface device of claim 1, wherein the transducer is formed at least in part by web-based manufacturing techniques.

13. A user interface device having sensory feedback comprising:
    a user contact surface;
    an electroactivc polymer transducer comprising an output member coupled to the contact surface; and
    a motion coupling mechanism extending between the user contact surface and the transducer,
wherein activation of the transducer moves at least a portion of the user contact surface and wherein the motion coupling mechanism is magnetic.

* * * * *